(12) United States Patent
Ng et al.

(10) Patent No.: US 8,135,364 B2
(45) Date of Patent: Mar. 13, 2012

(54) METHOD AND APPARATUS FOR CONTROLING OUTPUT POWER OF COMMUNICATION EQUIPMENT

(75) Inventors: Chin Wun Ng, Ipoh (MY); Chen Kok Yeoh, Bukit Mertajam (MY); Siew Yin Lee, Bayan Lepas (MY)

(73) Assignee: Motorola Solutions, Inc., Schaumburg, IL (US)

( * ) Notice: Subject to any disclaimer, the term of this patent is extended or adjusted under 35 U.S.C. 154(b) by 344 days.

(21) Appl. No.: 12/462,520

(22) Filed: Aug. 5, 2009

(65) Prior Publication Data
US 2010/0041354 A1 Feb. 18, 2010

(30) Foreign Application Priority Data
Aug. 13, 2008 (MY) .................................. PI20083082

(51) Int. Cl.
*H04B 1/04* (2006.01)
(52) U.S. Cl. .................... 455/127.1; 455/91; 455/127.3; 455/127.5
(58) Field of Classification Search ............... 455/91, 455/127.1, 127.3, 127.5
See application file for complete search history.

(56) References Cited

U.S. PATENT DOCUMENTS

| 5,892,403 | A  | * | 4/1999 | Brandt | 330/297 |
| 6,271,727 | B1 | * | 8/2001 | Schmukler | 330/284 |
| 7,606,016 | B1 | * | 10/2009 | Loeb et al. | 361/111 |

FOREIGN PATENT DOCUMENTS

WO WO2005002045 A1 1/2005
* cited by examiner

*Primary Examiner* — Tuan Pham
(74) *Attorney, Agent, or Firm* — Valerie M. Davis; Kenneth A. Haas (57) ABSTRACT

Communication equipment includes a circuit generating an RF input signal; a PA receiving a supply voltage, receiving the RF input signal, and providing an amplified version of the RF input signal as an output signal that is associated with an output power of the communication equipment; and an output circuit that includes an antenna for transmitting the output signal. The communication equipment also includes: a voltage detector circuit including sensing circuitry for sensing the supply voltage and a comparator for comparing the supply voltage to a first voltage threshold and generating a control signal when the supply voltage exceeds the first voltage threshold; and a disabling circuit coupled to the voltage detection circuit for disabling a portion of the communication equipment in response to the control signal to maintain output power of the communication equipment below a maximum output power level.

8 Claims, 9 Drawing Sheets

METHOD AND APPARATUS FOR CONTROLLING OUTPUT POWER OF COMMUNICATION EQUIPMENT

TECHNICAL FIELD

The technical field relates generally to communication equipment and more particularly to precision control of the output power of communication equipment containing transmitter apparatus having a power amplifier.

BACKGROUND

Transmitter apparatus that is included in communication equipment typically includes a power amplifier (PA), which is used to amplify a radio frequency (RF) signal prior to its transmission by an antenna over a communication channel. A parameter associated with operating the communication equipment is its output power, which is generally measured at the output of the antenna and which is affected by (although usually not by a linear relationship) output power of the PA. However, the term output power as used herein can include the power measured at any point in an output path of the transmitter apparatus from the PA output to the antenna output.

For some applications, it may be important to limit the output power of the communication equipment to a certain maximum output power. For example, International Standard IEC 60079-0 Edition 5.0 dated 10-2007 and published by International Electrotechnical Commission specifies, for safety reasons, a maximum output power for communication equipment. However, a problem is that many operational and/or failure conditions within the communication equipment (particularly in the transmitter apparatus) may cause an increase in its output power, some of which may require a quick counteractive response to prevent the output power from exceeding the maximum output power.

Thus, there exists a need for a method and apparatus for output power control that will control the output power of communication equipment under certain operational and/or failure conditions.

BRIEF DESCRIPTION OF THE FIGURES

The accompanying figures, where like reference numerals refer to identical or functionally similar elements throughout the separate views, which together with the detailed description below are incorporated in and form part of the specification and serve to further illustrate various embodiments of concepts that include the claimed invention, and to explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments. In addition, the description and drawings do not necessarily require the order illustrated. Apparatus and method components have been represented where appropriate by conventional symbols in the drawings, showing only those specific details that are pertinent to understanding the various embodiments so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

DETAILED DESCRIPTION

Generally speaking, pursuant to the various embodiments, communication equipment includes: an input generator circuit for generating a radio frequency input signal; a power amplifier (PA) having a voltage input for receiving a supply voltage, a second input for receiving the radio frequency input signal, and an output for providing an amplified version of the radio frequency input signal as an output signal, which is associated with an output power of the communication equipment; and an output circuit coupled to the power amplifier output and including an antenna for transmitting the output signal. The communication equipment also includes: a voltage detector circuit coupled the voltage input and comprising sensing circuitry for sensing the supply voltage and a comparator for comparing the supply voltage to a first voltage threshold and generating a control signal when the supply voltage exceeds the first voltage threshold; and a disabling circuit coupled to the voltage detection circuit for disabling a portion of the communication equipment in response to the control signal in order to maintain output power of the communication equipment below a maximum output power level. The disabling circuit can be coupled for example to the PA input or output, a voltage regulator circuit, a bias circuit for the PA, or a controller for the communication equipment.

In an embodiment, the disabling circuit can comprise an RF shunt circuit having a Zener diode that is enabled in response to the control signal to shunt an RF signal to a ground potential, wherein the RF signal is the RF input signal received into the PA or the amplified RF signal output from the PA. In another embodiment, the disabling circuit is a switch used to disable portions of the communication equipment.

A benefit of including in the communication equipment the voltage detector circuit combined with the disabling circuit is that during any operating and/or failure condition that increases the supply voltage to the PA above a threshold, the output power of the communication equipment is maintained below a maximum output power level, which will enhance the safety of the communication equipment. Another benefit is that the disabling circuit can be configured to operate in such a way that maintains the output power of the communication equipment at a level that satisfies customer operational requirements for the communication equipment. Those skilled in the art will realize that the above recognized advantages and other advantages described herein are merely illustrative and are not meant to be a complete rendering of all of the advantages of the various embodiments.

Figure 1:
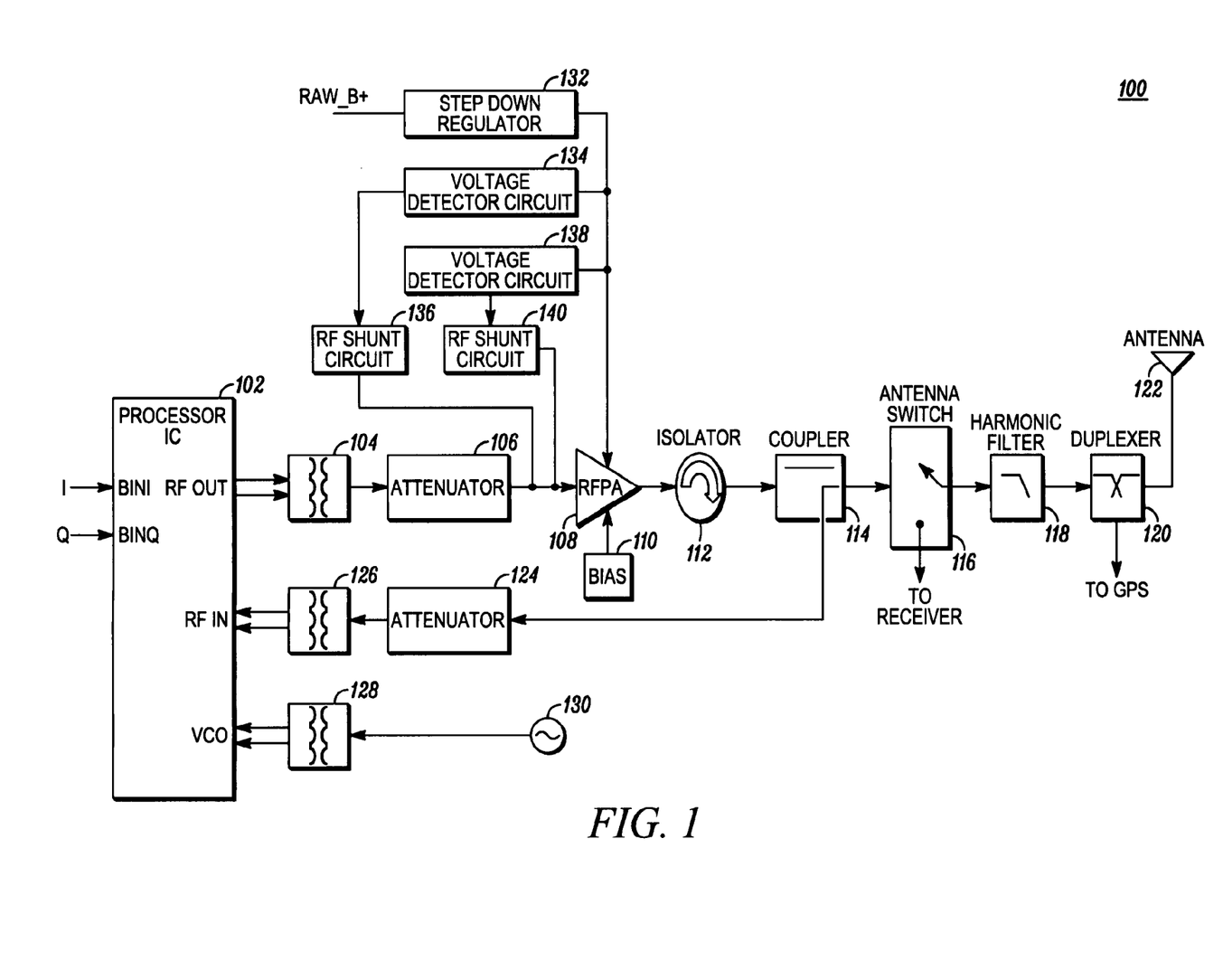
FIG. 1 is a block diagram of communication equipment with a disabling circuit coupled to a power amplifier (PA) input in accordance with an illustrative embodiment.

Referring now to the drawings, and in particular FIG. 1, a block diagram of communication equipment with a disabling circuit coupled to a PA input in accordance with an illustrative embodiment is shown and indicated generally at 100. Those skilled in the art, however, will recognize and appreciate that the specifics of this example are merely illustrative of some embodiments and that the teachings set forth herein are applicable in a variety of alternative settings. For example, since the teachings described do not depend on the type of communication equipment, modulation scheme, over-the-air air interface, or communication system in which the communication equipment is used, they can be applied to any type of communication equipment, modulation scheme, over-the-air air interface, or communication system. As such, other alternative implementations are contemplated and are within the scope of the various teachings described.

For example, the communication equipment can be various mobile devices or infrastructure devices. An infrastructure device is a device that is a part of a fixed network infrastructure and can receive information (either control or media, e.g., data, voice (audio), video, etc.) in a signal from a mobile device and transmit information in signals to one or more mobile devices via a communication link. An infrastructure device includes, but is not limited to, equipment commonly referred to as base stations, base transceiver stations, access points, routers or any other type of infrastructure equipment interfacing a wireless communication device in a wireless environment. A mobile device includes, but is not limited to, devices commonly referred to as wireless communication devices, access terminals, mobile radios, mobile stations, subscriber units, user equipment, or any other device capable of operating in a wireless environment. Examples of mobile devices include, but are not limited to, two-way radios, mobile phones, cellular phones, Personal Digital Assistants (PDAs), laptops and pagers.

The communication equipment can be used in second generation (2G) networks such as Global System for Mobile communication (GSM), General Packet Radio Service (GPRS), Enhanced Data rates for GSM Evolution (EDGE), Integrated Digital Enhanced Network (iDEN); third generation (3G) networks such as Universal Mobile Telecommunications System (UMTS), High-Speed Data Access (HSPA), Code Division Multiple Access (CDMA), Wideband CDMA (W-CDMA); and fourth generation (4G) networks such as Worldwide Interoperability for Microwave Access (WiMAX). The communication equipment could use one or more standards (including air interface standards) such as TETRA (Terrestrial Trunked Radio), or a standard defined in a publication issued by a standards body such as OMA (Open Mobile Alliance), 3GPP (3rd Generation Partnership Project), 3GPP2 (3rd Generation Partnership Project 2), IEEE (Institute of Electrical and Electronics Engineers) 802, and WiMAX Forum. Moreover, the communication equipment could use one or more wireless communication protocols and/or modulation schemes such as Advanced Mobile Phone System (AMPS), Code division multiple access (CDMA), Time division multiple access (TDMA), Global System for Mobile communications (GSM), Integrated Digital Enhanced Network (iDEN), General Packet Radio Service (GPRS), Enhanced Data rates for GSM Evolution (EDGE), Universal Mobile Telecommunications System (UMTS), Wideband Code Division Multiple Access (WCDMA), Code division multiple access 2000 (CDMA2000), and their variants.

Turning back to FIG. 1, communication equipment 100 includes transmitter apparatus that comprises a processor integrated circuit (IC) 102, a combiner 104, an attenuator 106, a RF PA 108, a bias circuit 110, an isolator 112, a coupler 114, an antenna switch 116, a harmonic filter 118, a duplexer 120, an antenna 122, an attenuator 124, splitters 126 and 128, a voltage controlled oscillator (VCO) 130, and a step down regulator 132. In accordance with the teachings herein, the transmitter apparatus further comprises voltage detector circuits 134 and 138 and disabling circuits 136 and 140. It should be noted that this illustrative implementation comprises two voltage detector circuits and two disabling circuits for redundancy in case one set of voltage detector and disabling circuits fail. However, use of just a single voltage detector circuit and disabling circuit is within the scope of the teachings herein.

During normal operation, the processor IC 102 receives baseband in-phase (I) and quadrature (Q) signals generated in a processing device (not shown) in the communication equipment 100. The processor IC 102 converts the baseband I and Q signals to RF I and Q signals that are combined into a single RF signal in combiner 104. Attenuator 106 attenuates the power of the combined RF signal to a level that would produce a desired output power level to satisfy operational (e.g., customer) requirements for the transmitter apparatus. The bias circuit 110 is used to turn on the RF PA 108 and to provide linear operation of the RF PA, so that the RF PA provides at its output a linear amplification of the RF input signal having sufficient power for transmission by the antenna 122. Isolator 112 isolates the RF PA 108 from any impedance changes of the antenna switch 116. Antenna switch 116 switches between the transmit path and a receive path (not shown) to eliminate the necessity of multiple antennas. Harmonic filter 118 reduces signal harmonics generated by the RF PA 108 and the antenna switch 116, and the duplexor 120 separates a GPS signal (which is provided to GPS apparatus, not shown) from the RF signal before the RF signal is transmitted at the antenna 122. A raw DC (direct current) voltage B+ (e.g., from an internal battery, for instance 7.5V) is supplied to the step down regulator 132, which steps down the battery voltage to a supply voltage, e.g., 3.25 V, that is provided to the RF PA during normal operating conditions.

Coupler 114 couples a portion of the RF signal as part of a Cartesian feedback loop to provide to the processor IC for regulating the RF PA output power. Additional elements of the feedback loop include the attenuator 124 that attenuates the coupled RF signal to a desired power level that can be handled by the processor IC 102 and the splitter 126 that splits the coupled RF signal into I and Q signals for processing by the processor IC 102. VCO 130 provides a signal having a frequency used by the processor IC to generate a desired transmit frequency of the RF output signal. Splitter 128 splits the VCO signal into I and Q signals before it is passed to the processor IC 102.

It is further assumed for purposes of the illustrative example, that the communication equipment 100 is operated in accordance with an output power requirement set forth in International Standard IEC 60079-0 Edition 5.0 of a maximum of 2 W (or 33 dBm, which is achieved when the supply voltage is about 3.5 V) for an average period of less than 20 μs, under normal and fault conditions. Moreover, under normal operating conditions in this illustrative embodiment, the desired output power is >1 W (about 29-30 dBm) and the saturation power is about 32.5 dBm, making the margin between the desired and the maximum output power a relatively small margin of 3.0 to 3.5 dBm, which translates into about a 0.25V difference between a wanted supply voltage value (to meet customer operational output power requirements) and an unwanted supply voltage value (that would cause the communication equipment to exceed the International Standard requirements). The precision voltage detector circuit and disabling circuit sets (134, 136 and 138, 140) are configured to operate by a method in accordance with the teachings herein to maintain the output power of the communication equipment 100 at less than a maximum output power (e.g., in this example 2 W) and can be configured to maintain the output power at a level to meet customer requirements (in this example >1 W). This output power requirement is met under normal operating conditions as well as failure conditions including one or more of the following: a failure in the Cartesian loop causing the processor IC 102 to be unable to provide output power control for the RF PA 108 or causing the processor IC to deliver maximum power to the RF PA; a failure in the step down regulator 132 causing it to provide a supply voltage to the RF PA 108 that is not the desired fixed voltage but is somewhere between the desired voltage and a maximum battery voltage.

Figure 2:
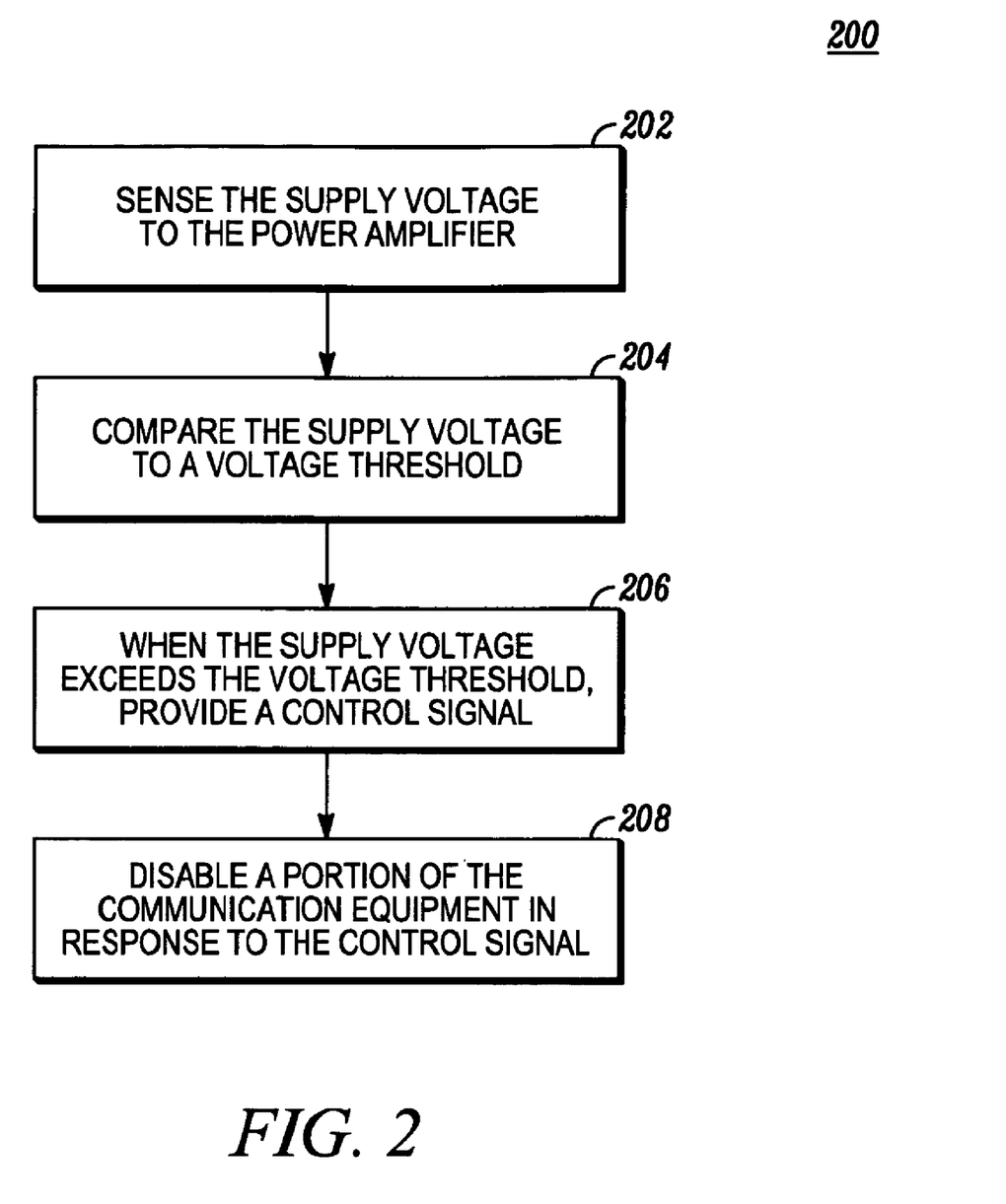
FIG. 2 is a flow diagram of a method for controlling output power of communication equipment in accordance with an illustrative embodiment.

Turning now to FIG. 2, a flow diagram of a method for controlling output power of communication equipment in accordance an illustrative embodiment is shown and generally indicated at 200. Method 200 is performed in the voltage detector circuits 134, 138 and disabling circuits 136, 140 of FIG. 1. Method 200 comprises a voltage detector circuit sensing (202) the supply voltage to the PA, comparing (204) the supply voltage to a voltage threshold, and when the supply voltage exceeds the threshold, providing (206) a control signal. The disabling circuit disables (208) a portion of the communication equipment in response to the control signal in order to maintain the output power of the communication equipment below a maximum output power level. As can be seen from FIG. 1, the disabling circuits 136 and 140 disable the RF input signal from being input into the RF PA 108.

Figure 3:
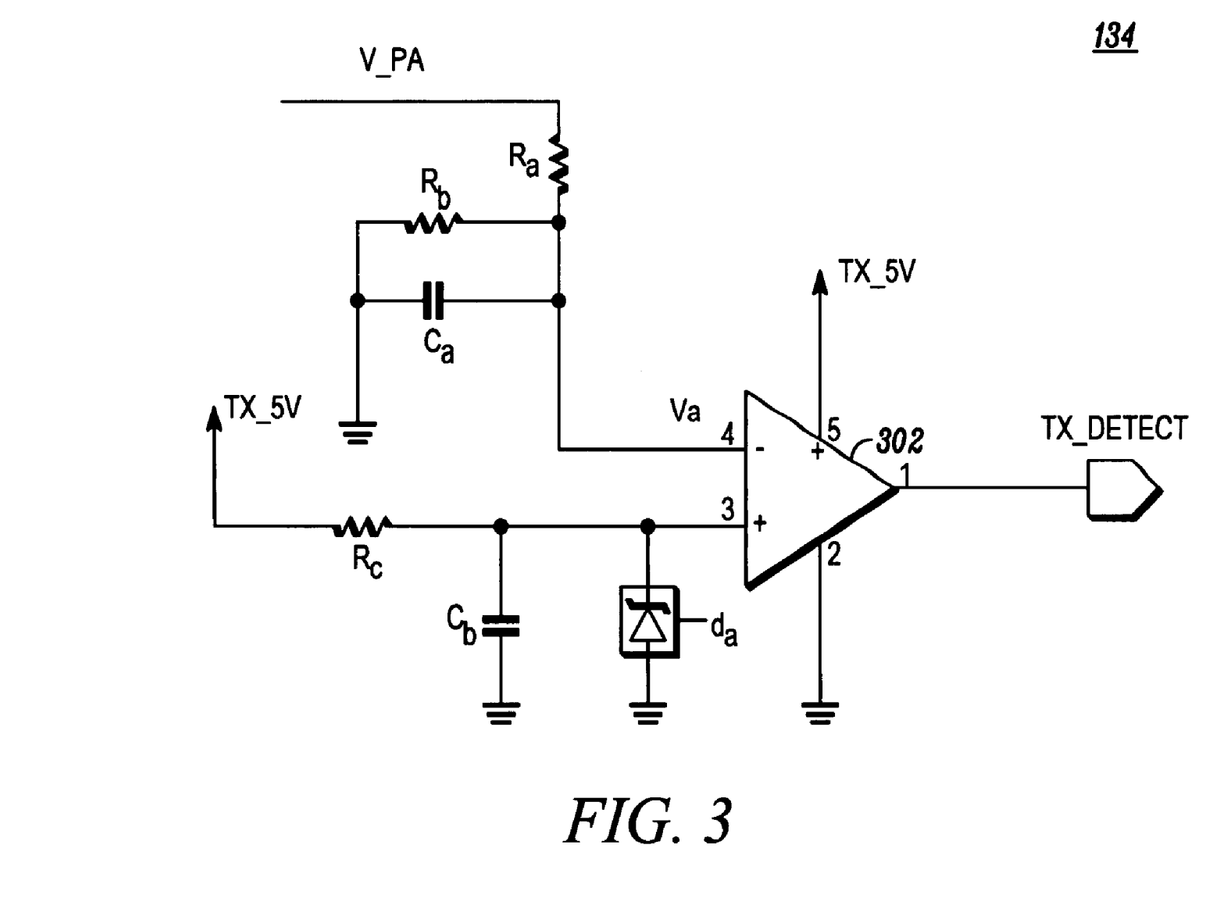
FIG. 3 is a block diagram of a voltage detector circuit in accordance with an illustrative embodiment.

Turning now to FIG. 3, a block diagram of a voltage detector circuit (such as voltage detector circuits 134 and 138) in accordance with an illustrative embodiment is shown and generally indicated at 134. Voltage detector circuit 134 comprises resistors $R_a$, $R_b$, $R_c$, capacitors $C_a$ and $C_b$, a diode $d_a$, and a comparator 302. In an embodiment, diode $d_a$ is connected between a positive input (pin 3) of the comparator 302 and a ground potential or "ground" (e.g., 0V). Diode $d_a$ is a precision Zener diode supplying a nominal voltage reference (or voltage threshold) and having a tolerance of about 0.1% in order to detect the small margin of difference between the wanted supply voltage 3.25 V and an unwanted supply voltage of >3.45 V, for instance. The voltage threshold is set such that the output power of the communication equipment stays below the maximum desired output power. For example, the threshold can be set from between 3.436 V to 3.449 volts. However, to use a Zener diode that is already set to a standard voltage reference, a Zener diode having a nominal voltage reference of 3.0 V can be selected. Resistor $R_c$ is connected between a voltage TX_5V and pin 3 and controls a current that turns on diode $d_a$. Capacitor $C_b$ is connected between pin 3 and ground and acts as a bypass capacitor to dampen any noise or AC (alternating current) in the circuit.

The supply voltage V_PA is sensed at an input of the voltage detector circuit. However, since the Zener diode supplies a voltage reference less than the range from which the threshold voltage is selected, the supply voltage has to be scaled down to Va before it can be used by the comparator 302. Resistor divider network $R_a$ and $R_b$ in combination with capacitor $C_a$, which is connected between a negative input (pin 4) of the comparator 302 and ground, performs the function of scaling the supply voltage V_PA to Va and supplying Va to pin 4. Va, $R_a$ and $R_b$ can be determined using the formula $$Va = V\_PA \times \left(\frac{Rb}{Ra + Rb}\right), \quad (1)$$

and the values of $C_a$ and $C_b$ can be selected to satisfy the operational and failure requirements of the communication equipment/

Voltage TX_5V is also supplied to a voltage input (pin 5) of the comparator 302 to turn this element on, and a pin 2 of the comparator 302 is connected to ground. Comparator 302 compares voltage Va to the threshold voltage and provides a control signal TX_DETECT at an output (pin 1) based on the results of he comparison. For example, if V+(pin 3)>V−(pin 4), TX_Detect=TX_5V (to disable the disabling circuit, e.g., an RF shunt circuit as described below); and if V+<V−, TX_Detect=0V (to enable the disabling circuit). Finally, a comparator must be selected that is fast enough to maintain the maximum output power requirements. Thus, in one embodiment, comparator 302 is selected with a Slew Rate >3.5 V/μs, which indicates the response time of the comparator. In another embodiment, the threshold for disabling the disabling circuit can be set to a lower value than the threshold for enabling the enabling circuit, for instance to a range of between 3.270V and 3.283V in this illustrative example.

Figure 4:
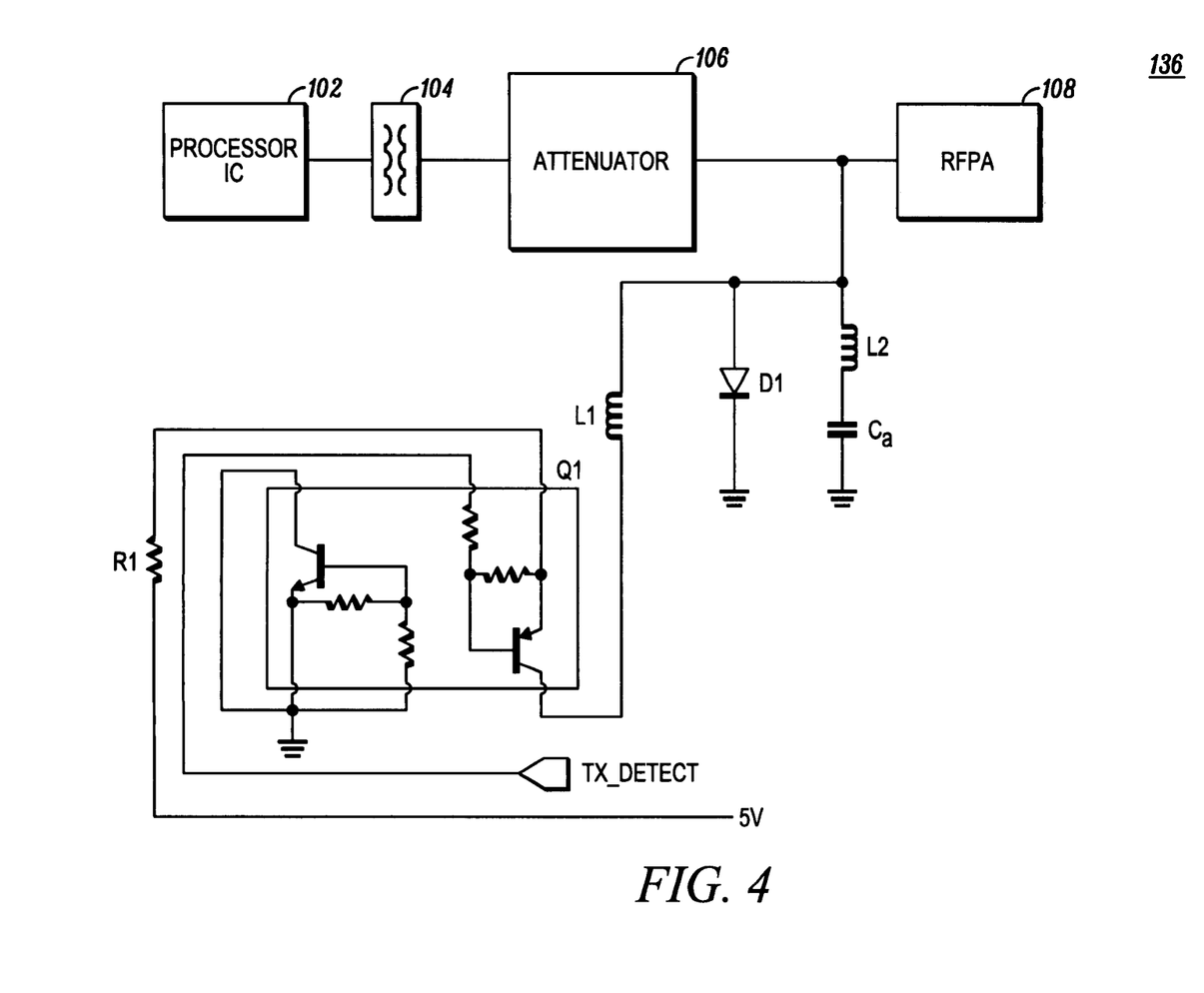
FIG. 4 is a block diagram of a disabled radio frequency (RF) shunt circuit in accordance with an illustrative embodiment.

Turning now to FIG. 4, a disabling circuit (e.g., 136, 140) in accordance with an illustrative embodiment is shown and generally indicated at 136. In this embodiment, circuit 136 is an RF shunt circuit that is basically constructed with a simple pin diode and some additional bias circuitry to shunt or divert most (if not substantially all) of the RF input signal from the processor IC 102 to ground in order to reduce the RF PA output signal, and thereby reduce the output power as measured at the RF PA output and at the antenna output.

RF shunt circuit 136 comprises a resistor R1, inductors L1 and L2, a pin diode D1, a capacitor C1, and a transistor network Q1 having two transistors and four resistors coupled in a known fashion, with the values of these components being selected to satisfy the operational and failure requirements of the communication equipment. The combination of R1 and Q1 coupled (via inductor L1) between a 5V input (e.g., TX_5V), the input of the RF PA 108 and ground serves as a switch to turn on diode D1 by supplying a bias current when the appropriate control signal TX_DETECT is received from the detector circuit, which in this case is 0V. Resistor R1 limits the current applied to diode D1 when switch Q1 is turned on. Diode D1, which is connected between inductor L1 (which acts as an RF choke to "choke of" any AC current), the input of the RF PA and ground, shunts the RF input signal to ground when the diode is in forward bias (i.e., is turned ON) and provides a high impedance when the diode is OFF (in this case when the control signal is 5V) so that substantially all of the RF input signal is coupled to the RF PA when D1 is turned OFF. The combination of L2 and C1 connected in series between the input of the RF PA and ground also serves to provide a high impedance when D1 is turned OFF.

Figure 5:
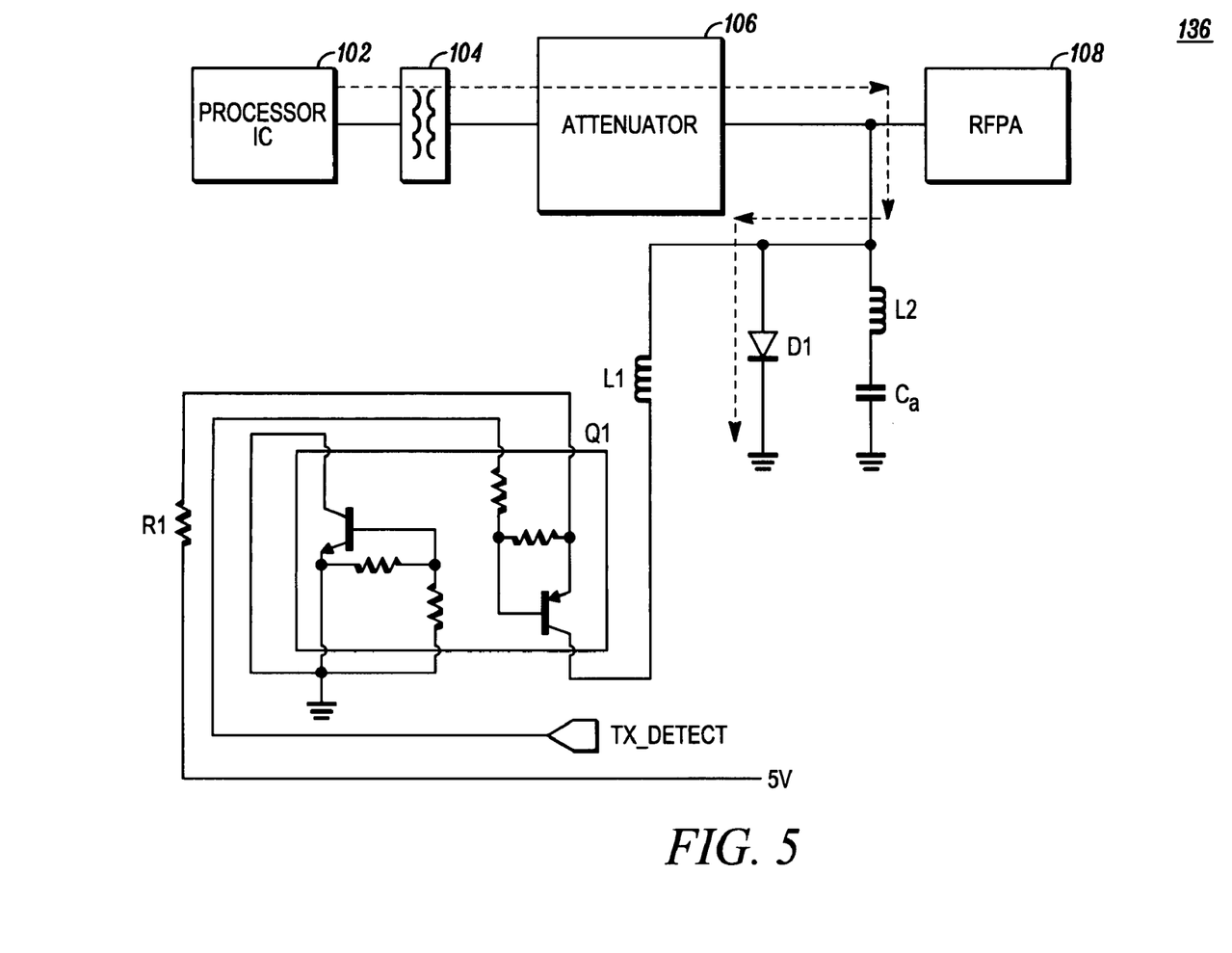
FIG. 5 is a block diagram of an enabled RF shunt circuit in accordance with an illustrative embodiment.

Turning now to FIG. 5, the block diagram of the shunt circuit of FIG. 5 is shown illustrating when the diode D1 is turned ON. Upon the control signal of 0V being received into the shunt circuit, Q1 provides the bias current to turn ON D1. Under this condition, an impedance of about 50 ohms is seen looking back into the processor IC circuit, and the impedance of diode D1 reduces to about 1 ohm to shunt the RF signal flow from the processor IC to ground as shown by the dashed line.

Figure 6:
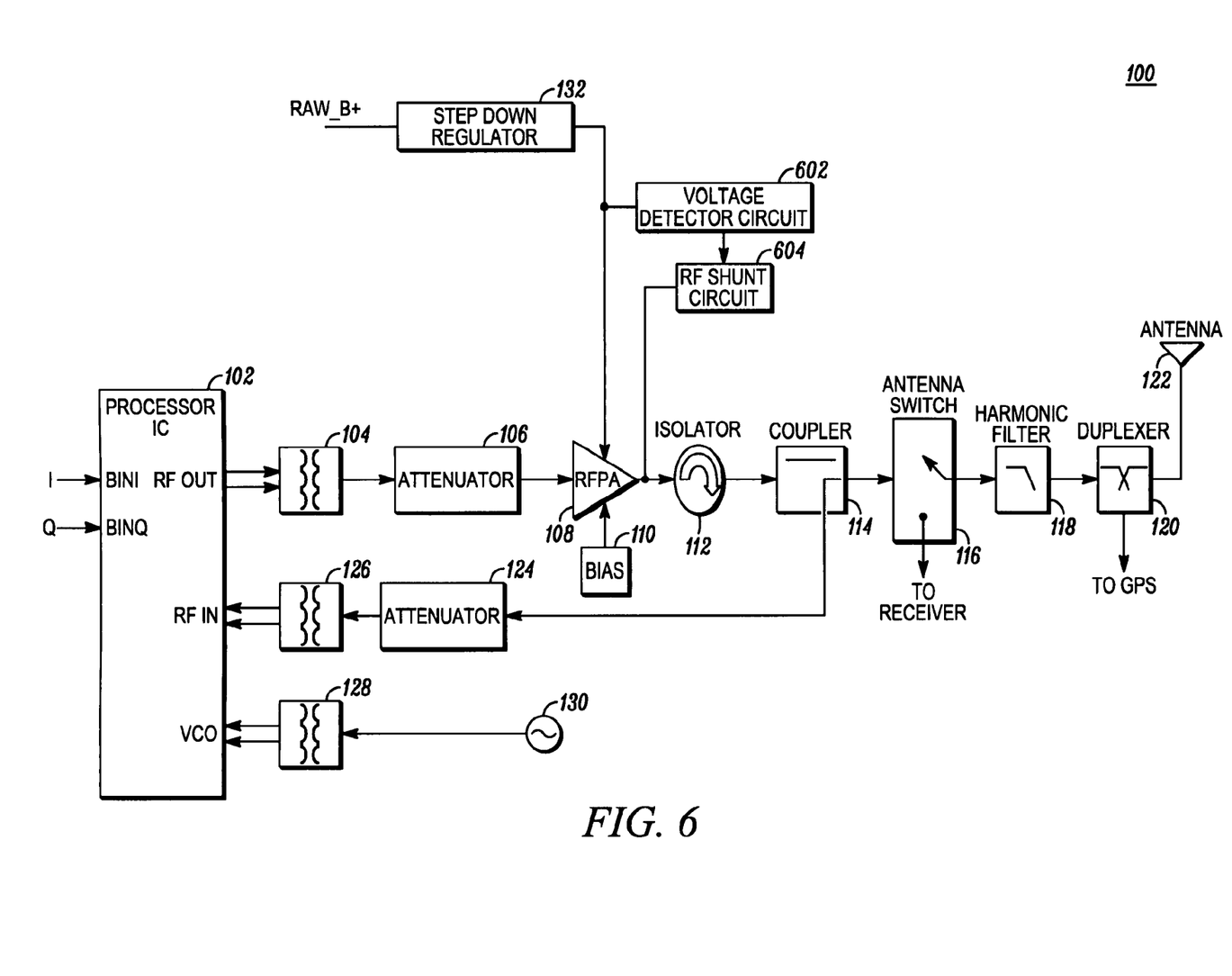
FIG. 6 is a block diagram of communication equipment with a disabling circuit coupled to a PA output in accordance with an illustrative embodiment.

In the above illustrative example, the disabling circuit was connected to the input of the RF PA. However, in other embodiments the disabling circuit can be connected elsewhere within the communication equipment to disable some other portion of the communication equipment when the voltage detector circuit provides a control signal that indicates that the supply voltage to the RF PA has exceeded a set threshold. For example, in FIG. 6, the disabling circuit is connected to the output of the RF PA. FIG. 6 includes transmitter apparatus elements identical to those in FIG. 1 of a processor IC 102, a combiner 104, an attenuator 106, a RF PA 108, a bias circuit 110, an isolator 112, a coupler 114, an antenna switch 116, a harmonic filter 118, a duplexer 120, an antenna 122, an attenuator 124, splitters 126 and 128, a voltage controlled oscillator (VCO) 130, and a step down regulator 132, the operation of which will not be repeated here for the sake of brevity. In accordance with the teachings herein, the transmitter apparatus further comprises a voltage detector circuit 602 and a disabling circuit 604 connected to the RF PA output. In an illustrative embodiment, the voltage detector circuit 602 is the same as that illustrated in FIG. 3, and the disabling circuit 604 is the same as that illustrated in FIG. 4 and FIG. 5.

Figure 7:
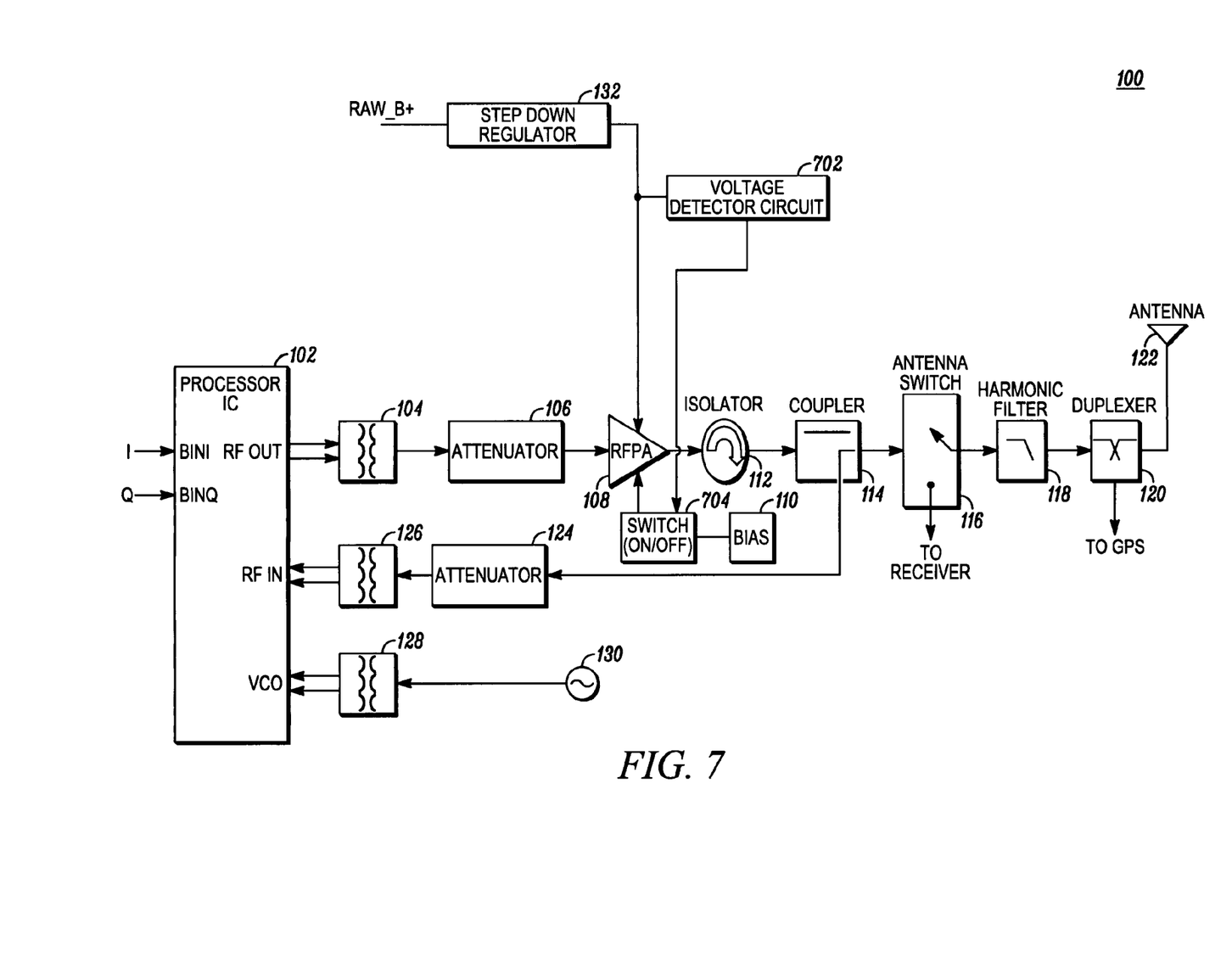
FIG. 7 is a block diagram of communication equipment with a disabling circuit coupled to a PA bias circuit in accordance with an illustrative embodiment.

In FIG. 7, the disabling circuit is connected to the bias circuit for the RF PA. FIG. 7 includes transmitter apparatus elements identical to those in FIG. 1 of a processor IC 102, a combiner 104, an attenuator 106, a RF PA 108, a bias circuit 110, an isolator 112, a coupler 114, an antenna switch 116, a harmonic filter 118, a duplexer 120, an antenna 122, an attenuator 124, splitters 126 and 128, a voltage controlled oscillator (VCO) 130, and a step down regulator 132, the operation of which will not be repeated here for the sake of brevity. In accordance with the teachings herein, the transmitter apparatus further comprises a voltage detector circuit 702 and a disabling circuit 704 connected to the RF PA bias circuit 110. In an illustrative embodiment, the voltage detector circuit 702 is the same as that illustrated in FIG. 3, and the disabling circuit 704 is a switch that prevents the bias circuit 110 from turning the RF PA ON, which effectively switches the bias circuit OFF. Switch 704 can be embodied, for example, as a known transistor network.

Figure 8:
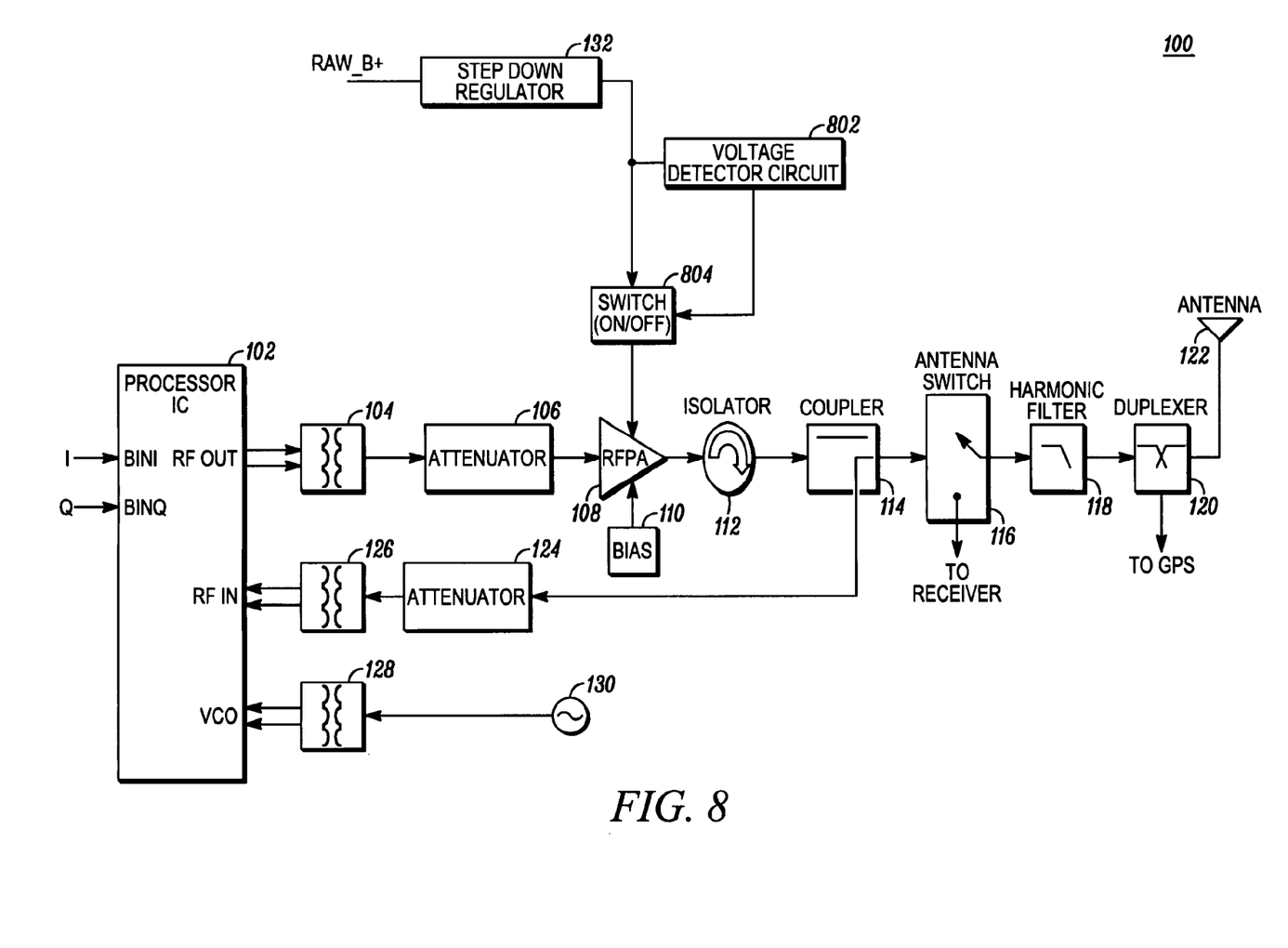
FIG. 8 is a block diagram of communication equipment with a disabling circuit coupled to a voltage regulator circuit in accordance with an illustrative embodiment.

In FIG. 8, the disabling circuit is connected to the step down regulator. FIG. 8 includes transmitter apparatus elements identical to those in FIG. 1 of a processor IC 102, a combiner 104, an attenuator 106, a RF PA 108, a bias circuit 110, an isolator 112, a coupler 114, an antenna switch 116, a harmonic filter 118, a duplexer 120, an antenna 122, an attenuator 124, splitters 126 and 128, a voltage controlled oscillator (VCO) 130, and a step down regulator 132, the operation of which will not be repeated here for the sake of brevity. In accordance with the teachings herein, the transmitter apparatus further comprises a voltage detector circuit 802 and a disabling circuit 804 connected to the step down regulator. In an illustrative embodiment, the voltage detector circuit 802 is the same as that illustrated in FIG. 3, and the disabling circuit 804 is a switch that disconnects the step down regulator and its supply voltage from the RF PA. Switch 804 can be embodied, for example, as a known transistor network.

Figure 9:
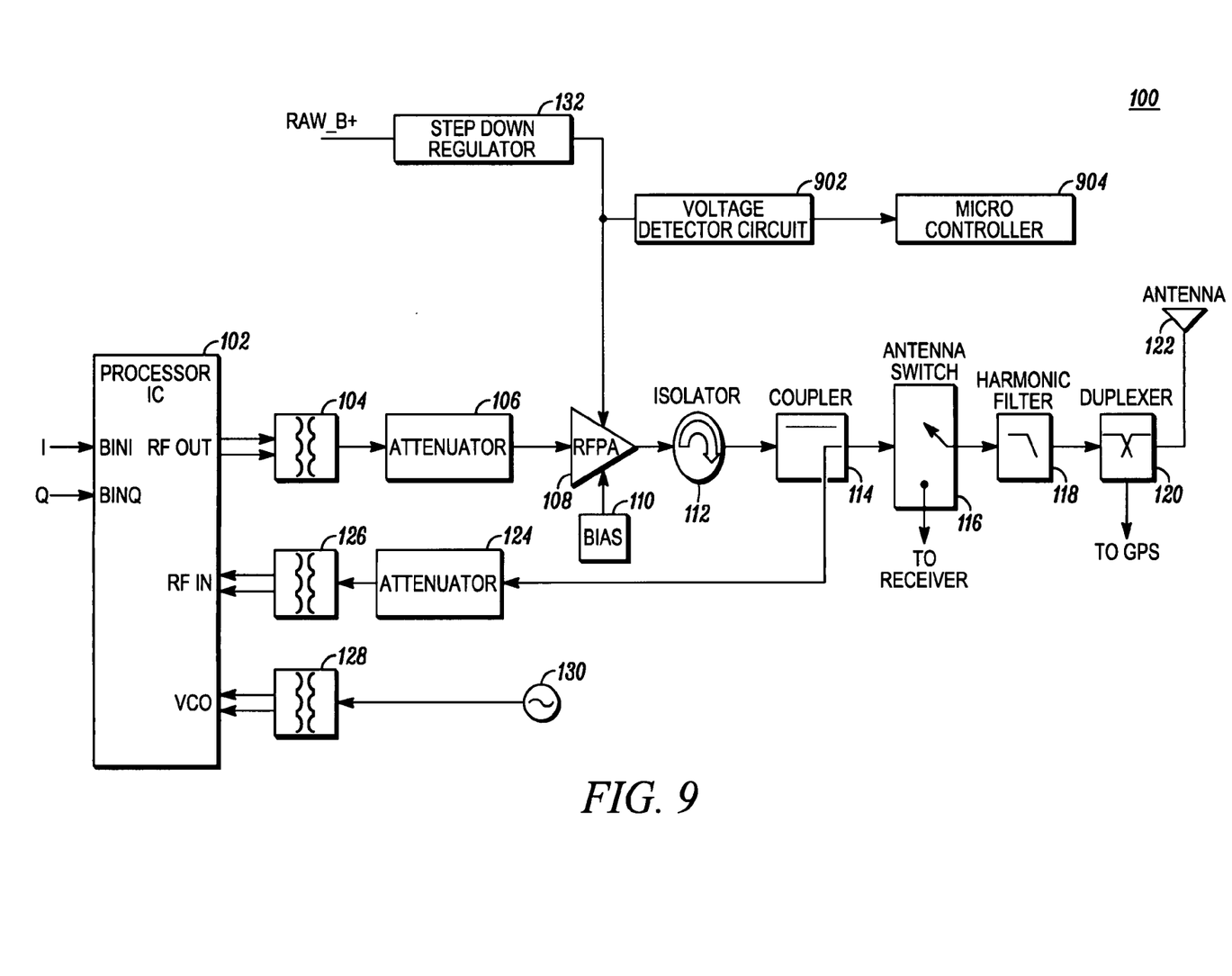
FIG. 9 is a block diagram of communication equipment with a disabling circuit comprising a micro-controller for the communication equipment in accordance with an illustrative embodiment.

In FIG. 9, the disabling circuit is included as part of a micro-controller that controls the transmitter apparatus. FIG. 9 includes transmitter apparatus elements identical to those in FIG. 1 of a processor IC 102, a combiner 104, an attenuator 106, a RF PA 108, a bias circuit 110, an isolator 112, a coupler 114, an antenna switch 116, a harmonic filter 118, a duplexer 120, an antenna 122, an attenuator 124, splitters 126 and 128, a voltage controlled oscillator (VCO) 130, and a step down regulator 132, the operation of which will not be repeated here for the sake of brevity. In accordance with the teachings herein, the transmitter apparatus further comprises a voltage detector circuit 902 and a micro-controller 904. In an embodiment, the micro-controller (which is under software control) upon receiving the disable signal from the voltage detector removes all the required signals and voltages to prevent the transmitter apparatus from operating. Accordingly, in this embodiment, the micro-controller functions as the disabling circuit. In an illustrative embodiment, the voltage detector circuit 902 is the same as that illustrated in FIG. 3. It should be further noted that in another embodiment, one or more redundant voltage detector and disabling circuits can be implement similar to the implementation illustrated in FIG. 1.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. For example, all operating voltages and currents, values of circuit elements, and maximum and operational output power requirements are meant only to be illustrative, and these values can be changed without affecting the scope of the teachings herein. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for controlling the output power of communication equipment described herein. The non-processor circuits may include, but are not limited to, a radio receiver, a radio transmitter, signal drivers, clock circuits, power source circuits, and user input devices. As such, these functions may be interpreted as steps of a method for controlling the output power of communication equipment described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a "processing device" for purposes of the foregoing discussion and claim language.

Moreover, an embodiment can be implemented as a computer-readable storage element or medium having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for controlling output power of communication equipment having circuitry that includes transmitter apparatus having a power amplifier, the method comprising:
   sensing a supply voltage to the power amplifier;
   comparing the supply voltage to a first voltage threshold;
   when the supply voltage exceeds the first voltage threshold, providing a control signal; and
   disabling a portion of the communication equipment in response to the control signal in order to maintain output power of the communication equipment below a maximum output power level;
   comparing the supply voltage to a second voltage threshold that is equal to or less than the first voltage threshold; and
   disabling the portion of the communication equipment until the supply voltage falls below the second voltage threshold.

2. The method of claim 1, wherein disabling a portion of the communication equipment comprises disabling a radio frequency input signal to the power amplifier.

3. The method of claim 2, wherein disabling the radio frequency input signal to the power amplifier comprises shunting the radio frequency input signal to a ground potential.

4. The method of claim 1, wherein disabling a portion of the communication equipment comprises disabling a radio frequency output signal from the power amplifier.

5. The method of claim 4, wherein disabling the radio frequency output signal from the power amplifier comprises shunting the radio frequency output signal to a ground potential.

6. The method of claim 1, wherein disabling a portion of the communication equipment comprises disconnecting the supply voltage to the power amplifier.

7. The method of claim 1, wherein disabling a portion of the communication equipment comprises turning off the transmitter apparatus or the power amplifier.

8. The method of claim 1, wherein the output power of the communication equipment is maintained below the maximum output power level during a failure in the transmitter apparatus.

* * * * *

UNITED STATES PATENT AND TRADEMARK OFFICE
CERTIFICATE OF CORRECTION

PATENT NO. : 8,135,364 B2  
APPLICATION NO. : 12/462520  
DATED : March 13, 2012  
INVENTOR(S) : Ng et al.

Page 1 of 1

It is certified that error appears in the above-identified patent and that said Letters Patent is hereby corrected as shown below:

On the title page, item (54), and Column 1, Line 2, in Title, delete "CONTROLING" and insert -- CONTROLLING --, therefor.

Signed and Sealed this
Eighteenth Day of December, 2012

David J. Kappos
*Director of the United States Patent and Trademark Office*